United States Patent [19]
Zaderej et al.

[11] Patent Number: 5,752,851
[45] Date of Patent: May 19, 1998

[54] CIRCUIT CLIP CONNECTOR

[75] Inventors: Victor V. Zaderej, Elgin, Ill.; Michael G. Todd, South Lyon, Mich.; Andrew Z. Glovatsky, Ypsilanti, Mich.; Peter J. Sinkunas, Canton, Mich.

[73] Assignee: Ford Motor Company, Dearborn, Mich.

[21] Appl. No.: 596,841

[22] Filed: Feb. 5, 1996

[51] Int. Cl.$^6$ ............................................. H01R 9/07
[52] U.S. Cl. ........................................ 439/493; 439/67
[58] Field of Search ........................... 439/493, 67, 77, 439/329

[56] References Cited

U.S. PATENT DOCUMENTS

| | | | |
|---|---|---|---|
| 4,054,348 | 10/1977 | Stroupe et al. | 439/329 |
| 4,420,206 | 12/1983 | Martyniak | 439/493 |
| 4,531,793 | 7/1985 | Hochgesang | 439/67 |
| 4,647,125 | 3/1987 | Landi et al. | 439/67 |
| 4,948,374 | 8/1990 | Carter | 439/67 |
| 5,306,162 | 4/1994 | Armendariz | 439/493 |
| 5,529,502 | 6/1996 | Peltier et al. | 439/493 |
| 5,622,517 | 4/1997 | Heng et al. | 439/417 |

FOREIGN PATENT DOCUMENTS 0073528   9/1983   European Pat. Off. ............ 439/67

*Primary Examiner*—P. Austin Bradley
*Assistant Examiner*—Tho D. Ta
*Attorney, Agent, or Firm*—Peter Abolins

[57] ABSTRACT

A clip connector includes an elongated main body, attachment arms extending from the main body, and protrusions for applying pressure extending from the main body. The main body is substantially elongated and the attachment arms are at one at each end. Intermediate the attachment arms are a plurality of protrusions for creating pressure points having spaces there between and adapted to be aligned with electrical conductors so that pressure is applied to the electrical conductors and electrical connections can be made.

1 Claim, 2 Drawing Sheets

CIRCUIT CLIP CONNECTOR

BACKGROUND OF THE INVENTION

1. Field of the Invention

This invention relates to forming electrical connections.

2. Prior Art

It is known to connect printed copper conductors formed on a substrate with other electrical conductors. Prior technology used a connector which was attached to the circuit board or a molded interconnect device. Also, it is known to connect electrical components such as capacitors, integrated circuits and resistors to electrical conductor runs on a substrate. Such connections can be made using heat and solder. There are disadvantages to using heat and solder because of the time, cost, and possible damage to components that such a procedure may cause.

It also known to use mechanical compression to from electrical connections. However, with mechanical compression there is the difficulty of providing a uniform force and ensuring that there is sufficient pressure to make the electrical connection and have it reliably function under various operating conditions such as vibration and temperature changes.

It would be desirable to have a mechanical connection which provides sufficient pressure in a form which is easily assembled and provides a reliable compression force. These are some of the problems this invention overcomes.

SUMMARY OF THE INVENTION

This invention uses a molded snap latch which is quickly assembled and has protruding pressure points formed at the regions where electrical connection is desired. Thus, there is no need for conventional connections nor for soldering to substrates. Further, the molded snap latch is a very low cost component.

This clip connector eliminates the need for a conventional connector and its associated cost. In many cases, for example, a clip connector can be molded as part of a larger plastic assembly and the incremental cost of the snap latch would be essentially zero when molded from vestige.

DETAILED DESCRIPTION OF THE INVENTION

Figure 1:
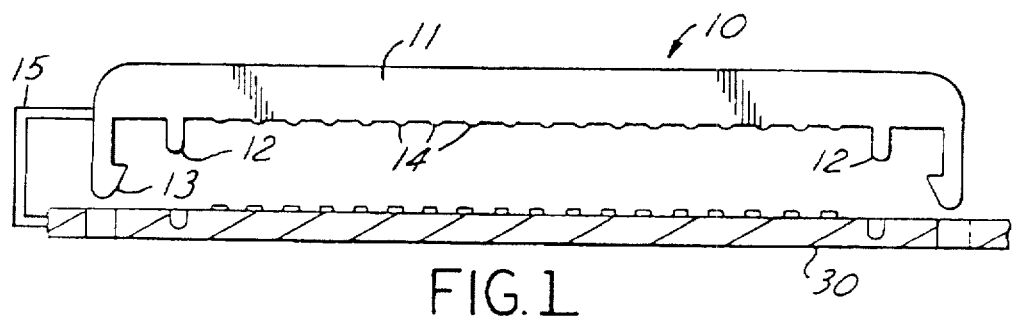
FIG. 1 is a side view a clip connector In accordance with an embodiment to this invention.

Referring to FIG. 1, a snap latch 10 includes an elongated main body 11 having at each end a guide pin 12 and a latching arm 13. Along main body 11 on the same side as guide pins 12 are a plurality of pressure points 14 which are sufficiently rigid to apply pressure to an electrical conductor to insure an electrical connection. The distance between the ends of main body 11 is advantageously less than six inches so that a substantially uniform pressure is applied along the length of main body 11 to reduce the effects of creep, which describes the time dependent strain, i.e., movement or displacement, of a part by an applied constant stress. High creep, or deformation, eventually results in low force. Main body 11 need not be planar and can include a curvilinear position. Such a curvilinear position would be adapted to mate with conductors mounted on a similar curvilinear surface. Therefore, a connection 15 can be advantageously integrally molded with snap latch 10 and circuit board 30 to reduce cost.

Figure 2:
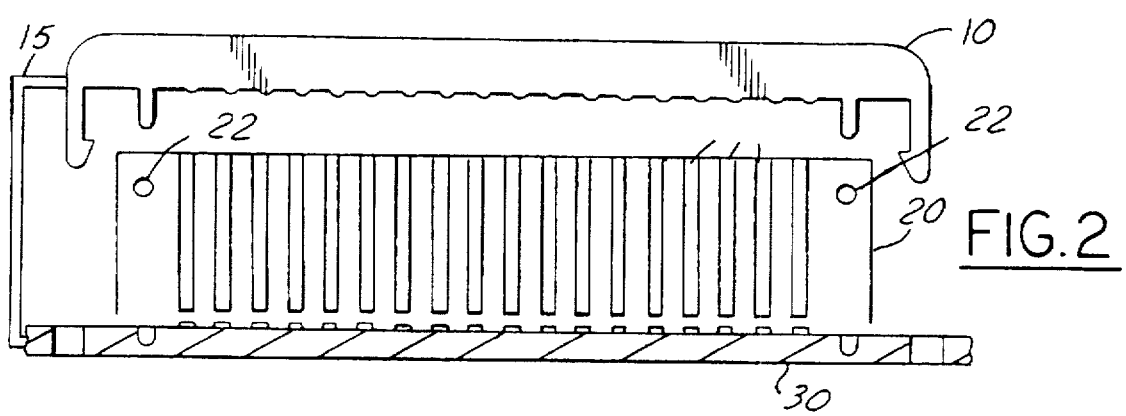
FIG. 2 is a clan view of a flexible circuit with electrical conductors for receiving the clip connector in accordance with an embodiment of this invention.

Referring to FIG. 2, a flexible circuit 20 has a plurality of electrical conductors 21 positioned to be aligned with pressure points 14. Guide holes 22 are positioned at either end of the plurality of electrical conductors 21 and receive guide pins 12. The edge of flexible substrate 20 is such that latches 13 can snap around it and secure latch 10 to circuit 20.

Figure 3:
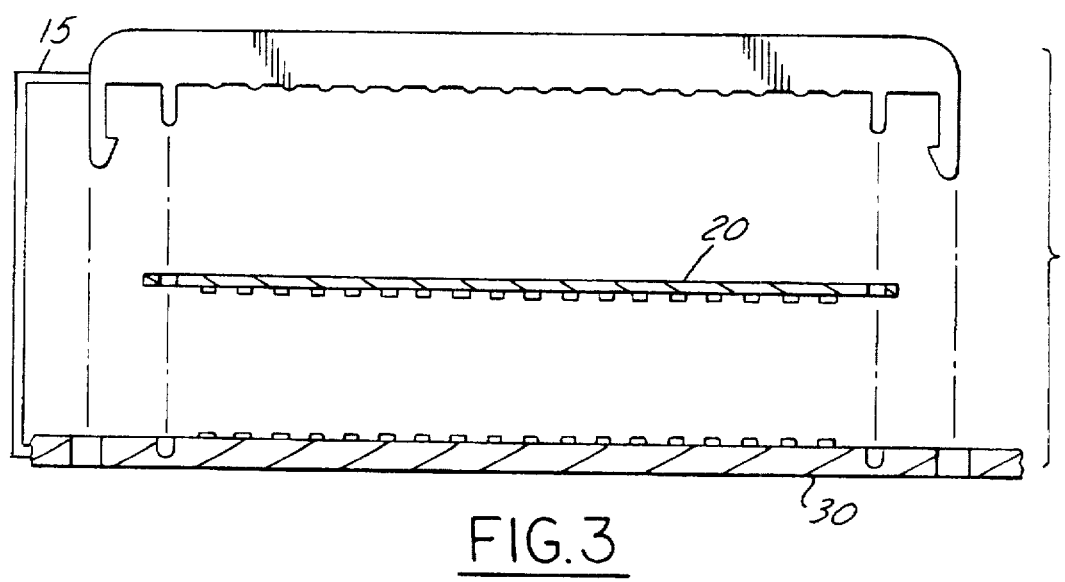
FIG. 3 is a side view of the clip connector and receiving substrate in an unmated condition.
Figure 4:
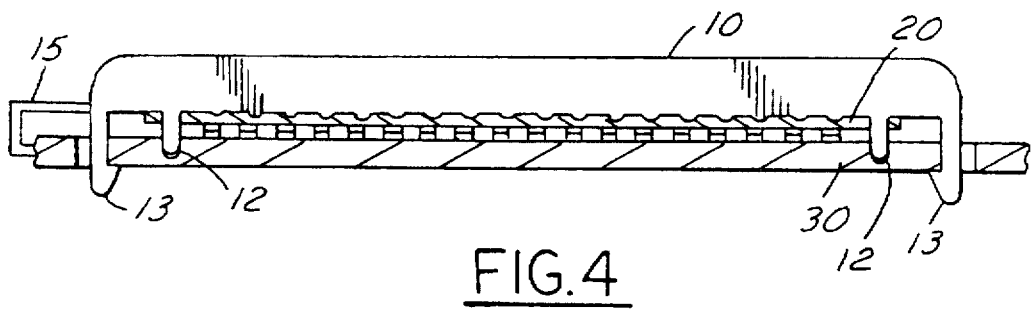
Figure 5:
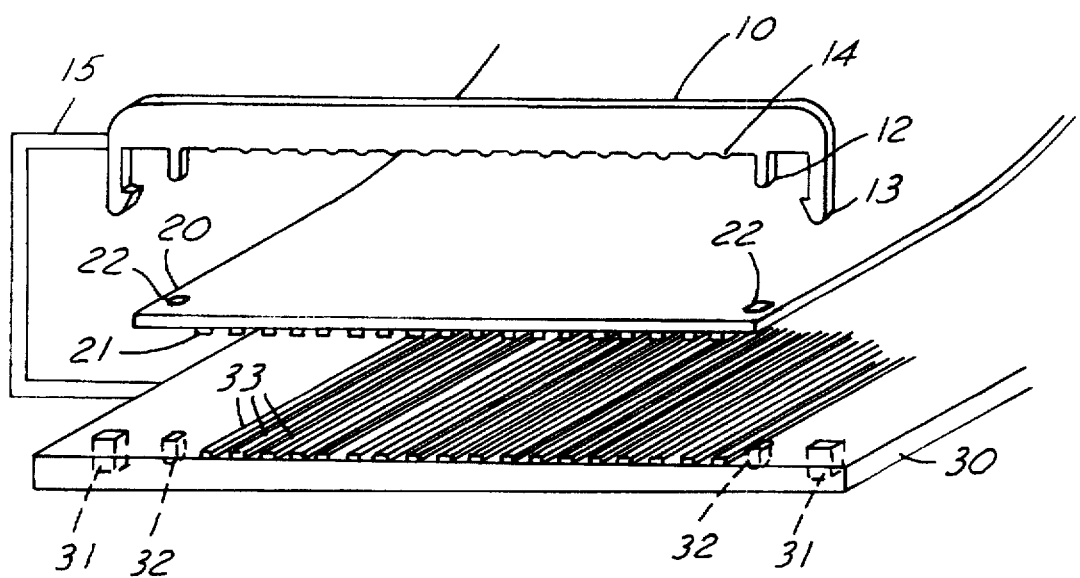
FIG.5 is a perspective view of the clip connector and receiving substrate in an unmated condition.

Advantageously, the spacing between latches 13 is sufficiently small so that main body, 11 does not flex to the point where insufficient pressure is applied by pressure points 14 to conductors 21. A typical material for clamp 10 is an engineering thermoplastic polymer, such as, but limited to, acrylonitrite-butadiene-styrene copolymer (ABS), polypropylene, polystyrene, polyetherimide, polyethersulfone, or a thermosetting polymer, such as, but not limited to phenol-formaldehyde, polyurethane, or epoxy. All such systems may employ filler materials to advantageously increase the materials' modulus and decrease susceptibility to creep Referring to FIGS. 3, 4, and 5, clip connector 10 is attached to a circuit board 30 which has pressure clip receiving openings 31 for receiving pressure latch clips 13. Circuit board 30 also has a pair of spaced alignment openings 32 for receiving alignment pin 12 as it passes through alignment opening 22 of the flex circuit 20. The copper conductors 21 of flex circuit 20 are aligned with copper conductors 33 of to circuit board 30 and also with pressure points 14 of clip connector 10. As a result, a quick efficient assembly procedure can be used to produce reliable electrical connections without the use of heat. Advantageously, the spacing of the clip connector 10 when seated and circuit board 30 is such that there is in the preferred case, approximately 5–100 psi of pressure applied by pressure points 14 to conductors 21 of flex circuit 20 and conductors 33 of circuit board 30.

Various modifications and variations will no doubt occur to those skilled in the art to which this invention pertains. For example, the configuration of the pressure points and the configuration of the latching protrusion may be varied from that disclosed herein. These and all other variations which basically rely on the teachings through which this disclosure has advanced the art are properly considered within the scope of this invention.

What is claimed:

1. An electrical connection assembly including:

a clip connector having an elongated polymer main body with attachment means, alignment means, and pressure points extending from the elongated body in the same direction as the attachment means;

said pressure points comprising longitudinally spaced molded protrusions for applying pressure extending from the main body, thereby applying pressure at points or regions where electrical connection is desired and to hold a flexible circuit down to a substrate circuit board, having a nonplanar, metallized molded polymeric substrate, thus eliminating the need for conventional flex connections or for soldering to substrates;

said flexible circuit having a first shape with parallel stripes of conductor;

said circuit board having a second shape with parallel stripes of conductor, the conductors on the circuit board being aligned with the conductors on the flexible circuit and being aligned with said protrusions on the clip connector, said first and second shapes being adapted to generally conform to each other;

said clip connector having a shape suitable for applying pressure between the flexible circuit and the circuit board;

said clip connector is integrally molded with the circuit board thus eliminating the need for a connector housing;

said circuit board further including openings for receiving the attachment means from the clip connector and said flexible circuit and said circuit board having aligned openings for receiving alignment pins extending from the clip connector; and wherein the pressure points act to concentrate the pressure from the attachment means and a distance between the attachment means is advantageously less than about six inches in order to reduce effects of creep.

* * * * *